(12) United States Patent
Zhou

(10) Patent No.: US 10,705,636 B2
(45) Date of Patent: Jul. 7, 2020

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Hongyu Zhou, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 4 days.

(21) Appl. No.: 16/099,201

(22) PCT Filed: Aug. 13, 2018

(86) PCT No.: PCT/CN2018/100264
§ 371 (c)(1),
(2) Date: Nov. 6, 2018

(87) PCT Pub. No.: WO2019/242083
PCT Pub. Date: Dec. 26, 2019

(65) Prior Publication Data
US 2019/0391691 A1     Dec. 26, 2019

(30) Foreign Application Priority Data

Jun. 21, 2018   (CN) .......................... 2018 1 0645723

(51) Int. Cl.
*G06F 3/041* (2006.01)
*H01L 27/32* (2006.01)
*H01L 51/52* (2006.01)

(52) U.S. Cl.
CPC .......... *G06F 3/0412* (2013.01); *H01L 27/323* (2013.01); *H01L 27/3276* (2013.01);
(Continued)

(58) Field of Classification Search
CPC ......... G06F 3/0412; G06F 2203/04103; G06F 2203/04107; H01L 27/323; H01L 51/5237;
(Continued)

(56) References Cited

U.S. PATENT DOCUMENTS

2018/0188858 A1   7/2018 Zhang et al.
2018/0356664 A1   12/2018 Yang
(Continued)

FOREIGN PATENT DOCUMENTS

CN      105845033 A     8/2016
CN      205900544 U     1/2017
(Continued)

*Primary Examiner* — Adam R. Giesy
(74) *Attorney, Agent, or Firm* — Mark M. Friedman

(57) ABSTRACT

A display panel and a display device are provided. The display panel includes a substrate, a thin film transistor layer, an organic light emitting diode (OLED) layer, a thin film encapsulation layer, a first common electrode layer, a cover plate, and conductive lines. An area without touch function of the display panel is eliminated by disposing the conductive lines at a side of the first common electrode plate, placing the conductive lines and the first common electrode plate respectively on two film layers, and electrically connecting with each other via through holes of an insulation layer.

6 Claims, 5 Drawing Sheets

(52) U.S. Cl.
CPC ...... *H01L 51/5237* (2013.01); *H01L 51/5206* (2013.01); *H01L 51/5221* (2013.01)

(58) Field of Classification Search
CPC .............. H01L 27/3276; H01L 51/5221; H01L 51/5206
See application file for complete search history.

(56) References Cited

U.S. PATENT DOCUMENTS

2019/0279972 A1    9/2019  Lin et al.
2019/0302919 A1*  10/2019  Clark .................... G06F 3/0443

FOREIGN PATENT DOCUMENTS

| CN | 205944094 U | 2/2017 |
|---|---|---|
| CN | 107193144 A | 9/2017 |
| CN | 107403804 A | 11/2017 |

\* cited by examiner

DISPLAY PANEL AND DISPLAY DEVICE

CROSS REFERENCE TO RELATED APPLICATIONS

This application is a U.S. National Phase application submitted under 35 U.S.C. § 371 of Patent Cooperation Treaty Application serial No. PCT/CN2018/100264, filed on Aug. 13, 2018, which claims the priority of China Patent Application serial No. 201810645723.5, filed on Jun. 21, 2018, the disclosures of which are incorporated herein by reference in their entirety.

FIELD OF INVENTION

The present invention relates to field of display technologies, and more particularly to a display panel and a display device.

BACKGROUND OF INVENTION

In flat panel display technology, organic light emitting diode (OLED) displays have many advantages such as light and thin, active illumination, fast response, wide viewing angles, wide color gamut, high brightness, and low power consumption. OLED displays have gradually become the third-generation display technology after liquid crystal displays. Compared with liquid crystal displays (LCDs), OLED have advantages of more power savings, thinner, and wider viewing angles, which is unmatched by LCDs. At present, people are increasingly demanding higher level of detail, that is, the resolution, but production of high-quality, high-resolution OLED displays still faces many challenges.

With development of display technology, OLED panels are being adopted by more and more electronic products, and flexible OLEDs have attracted much attention due to their flexibility. Touch sensor used in flexible OLED panel is mainly out-cell type, that is, the sensor module is completed on the film layer structure and then attached to the OLED panel. The production of touch sensor directly on flexible OLED panel needs to consider influence of the electron emission layer (i.e., the cathode) of OLED on the touch sensor signal.

In existing technology, touch sensor is divided into two types: self-capacitance and mutual capacitance:

1. The mutual capacitance touch screen has a large capacitance between the electron emission layer (i.e., the cathode) of OLED and touch sensor, resulting in a large capacitance, which affects the sensitivity of the touch.

2. The self-capacitance touch screen (single layer multi-point) divides the entire screen into M*N areas, each area is a separate transparent conductive electrode block, and each transparent conductive electrode block passes the signal line and touch on the same layer. That is, each transparent conductive electrode block independently forms a capacitance to the surrounding environment. When finger approaches a transparent conductive electrode at a certain position, a coupling capacitor is introduced, causing the detected capacitance to increase, and the IC determines that the position is touched. However, since the signal line occupies a part of the touch screen, the touch cannot be achieved at this position. Therefore, the single-layer multi-point self-capacitance touch screen has poor touch precision issues.

SUMMARY OF INVENTION

The present invention provides a display panel and a display device to solve the technical problem that the existing display panel has poor touch precision.

In order to solve the above-mentioned problems, the technical solutions provided by the present invention are as follows:

The present invention provides a display panel, wherein the display panel includes:

a substrate;

a thin film transistor layer formed on the substrate;

an organic light emitting diode (OLED) layer formed on the thin film transistor layer;

a thin film encapsulation layer formed on a cathode layer;

a first common electrode layer formed on the thin film encapsulation layer, wherein the first common electrode layer includes at least two first common electrode plates;

a cover plate formed on the first common electrode layer; and conductive lines formed between the cover plate and the first common electrode plates, or between the first common electrode plates and the thin film encapsulation layer, wherein the conductive lines correspond to the first common electrode plates;

wherein when the display panel is in a touch state, the first common electrode plates of the first common electrode layer are configured to output a touch signal according to a touch operation, and the touch signal is transmitted to a driver chip through the conductive lines.

According to a preferred embodiment of the present invention, at least one insulation layer is disposed between the conductive lines and the first common electrode plates.

According to a preferred embodiment of the present invention, the insulation layer is formed with at least one through hole, the conductive lines are electrically connected with the first common electrode plates via the through hole.

The present invention further provides a display device, including a display panel which includes:

a substrate;

a thin film transistor layer formed on the substrate;

an organic light emitting diode (OLED) layer formed on the thin film transistor layer;

a thin film encapsulation layer formed on a cathode layer;

a first common electrode layer formed on the thin film encapsulation layer, wherein the first common electrode layer includes at least two first common electrode plates;

a cover plate formed on the first common electrode layer; and conductive lines formed at a side of the first common electrode layer, wherein the conductive lines correspond to the first common electrode plates;

wherein when the display panel is in a touch state, the first common electrode plates of the first common electrode layer are configured to output a touch signal according to a touch operation, and the touch signal is transmitted to a driver chip through the conductive lines.

According to a preferred embodiment of the present invention, the conductive lines are formed between the cover plate and the first common electrode plates.

According to a preferred embodiment of the present invention, the conductive lines are formed between the first common electrode plates and the thin film encapsulation layer.

According to a preferred embodiment of the present invention, at least one insulation layer is disposed between the conductive lines and the first common electrode plates.

According to a preferred embodiment of the present invention, the insulation layer further comprises at least one through hole, the conductive lines are electrically connected with the first common electrode plates via the through hole.

The present invention further provides a display panel, wherein the display panel includes:

a substrate;

a thin film transistor layer formed on the substrate;

an organic light emitting diode (OLED) layer formed on the thin film transistor layer;

a thin film encapsulation layer formed on a cathode layer;

a first common electrode layer formed on the thin film encapsulation layer, wherein the first common electrode layer includes at least two first common electrode plates;

a cover plate formed on the first common electrode layer; and conductive lines formed at a side of the first common electrode layer, wherein the conductive lines correspond to the first common electrode plates;

wherein when the display panel is in a touch state, the first common electrode plates of the first common electrode layer are configured to output a touch signal according to a touch operation, and the touch signal is transmitted to a driver chip through the conductive lines.

According to a preferred embodiment of the present invention, the conductive lines are formed between the cover plate and the first common electrode plates.

According to a preferred embodiment of the present invention, the insulation layer further comprises at least one through hole, the conductive lines are electrically connected with the first common electrode plates via the through hole.

The beneficial effect of the present invention: the present invention eliminates the area without touch-control function on the display panel and improves the touch precision of the OLED touch screen by placing a plurality of conductive lines on one side of the first common electrode plate, by placing the conductive lines and the first common electrode plate on the two film layers respectively, and electrically connecting via the through holes of the insulation layer.

DESCRIPTION OF DRAWINGS

In order to more clearly illustrate the technical solutions in the embodiments or the prior art, the following drawings, which are intended to be used in the description of the embodiments or the prior art, will be briefly described. It will be apparent that the drawings and the following description are only some embodiments of the present invention. Those of ordinary skill in the art may, without creative efforts, derive other drawings from these drawings.

DETAILED DESCRIPTION OF PREFERRED EMBODIMENTS

Figure 1:
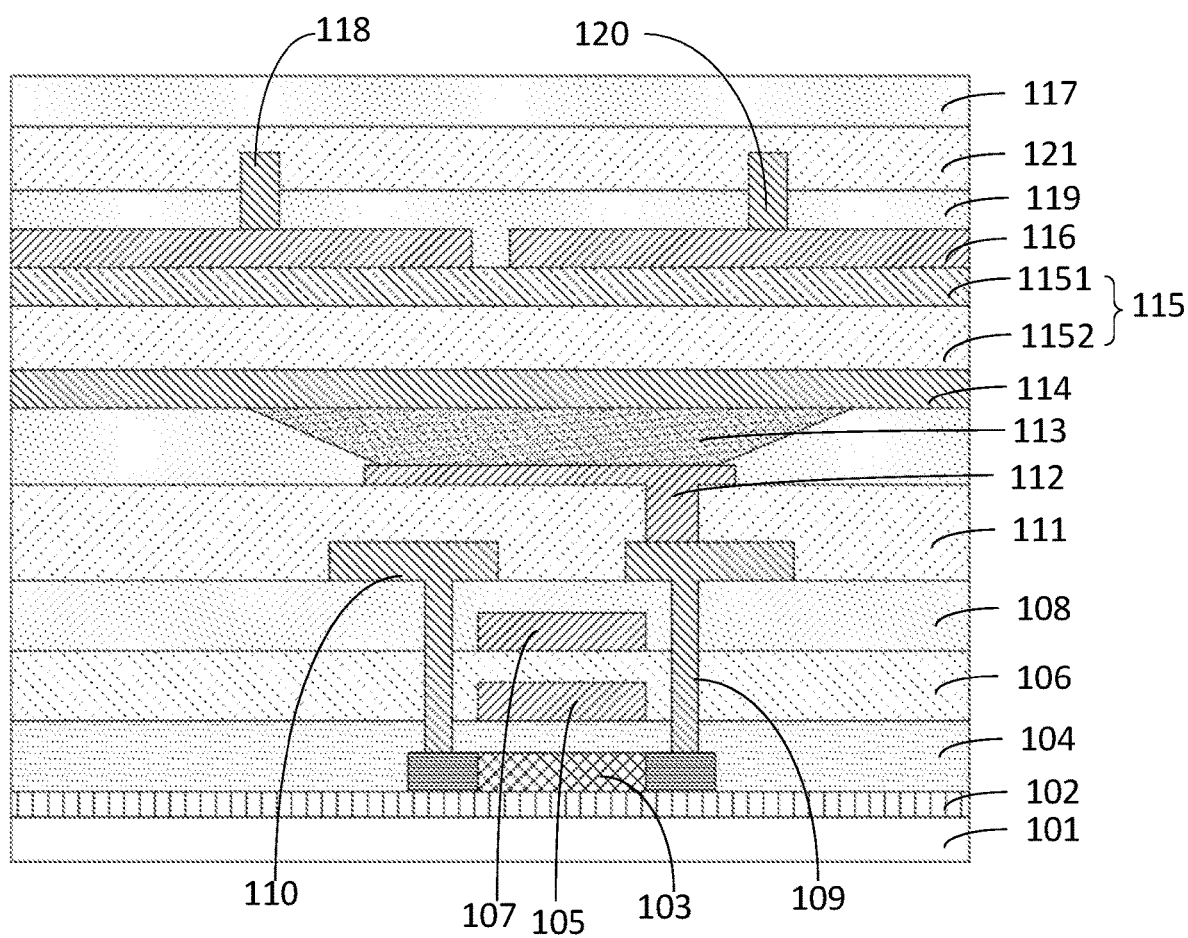
FIG. 1 is a structural diagram of a film layer of a display panel according to a first embodiment of the present invention.

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", "left", "right", "inside", "outside", "side", etc., is used with reference to the orientation of the figure(s) being described. As such, the directional terminology is used for purposes of illustration and is in no way limiting. Throughout this specification and in the drawings like parts will be referred to by the same reference numerals.

FIG. 1 shows a display panel of the present invention, the display panel includes a substrate 101, a thin film transistor layer, an organic light emitting diode (OLED) layer 113, a thin film encapsulation layer 115, a first common electrode layer 116, a cover plate 117, and conductive lines 118.

The substrate 101, the raw material of the substrate 101 may be one of a glass substrate, a quartz substrate, a resin substrate, and the like.

The thin film transistor layer is formed on the substrate 101. The thin film transistor layer includes an etch barrier layer (Etch Stop Layer, ESL) type, back channel etch (Back Channel Etch, BCE) type or a top gate thin film transistor (Top-gate) type. There are no specific restrictions. This embodiment is described by taking a top gate thin film transistor type as an example.

The thin film transistor layer includes a buffer layer 102, an active layer 103, a first insulation layer 104, a first gate electrode 105, a second insulation layer 106, a second gate electrode 107, a third insulation layer 108, a source drain electrode 110, and a planarization layer.

The buffer layer 102 is formed on the substrate 101. The buffer layer 102 is mainly used for buffering the pressure between the lamellar structures of the film, and may also have a function of blocking water and oxygen.

The active layer 103 is formed on the buffer layer, and the active layer 103 includes a doped region which is doped by ions.

The first insulation layer 104 is formed on the active layer 103. In the present embodiment, the first insulation layer 104 is an interlayer insulation layer, and the interlayer insulation layer covers the active layer 103. The interlayer insulation layer is used to isolate the active layer 103 from other metal layers.

The first gate electrode 105 is formed on the first insulation layer 104. The metal material of the first gate electrode 105 may generally be a metal such as molybdenum, aluminum, aluminum-nickel alloy, molybdenum-tungsten alloy, chromium, or copper. The metal material of the first gate electrode 105 is also possible to use a combination of the above several metal materials.

The second insulation layer 106 is formed on the first gate electrode 105. In the present embodiment, the second insulation layer 106 is a first gate insulation layer, the second gate insulation layer covers the active layer 103, and the first gate insulation layer is mainly used to isolate the first gate electrode 105 and the second gate electrode 107. Preferably, the thickness of the second insulation layer 106 is 50-200 nm. The material of the first gate insulation layer is usually silicon nitride. Silicon oxide, silicon oxynitride or the like may also be used for the first gate insulation layer.

The second gate electrode 107 is formed on the second insulation layer 106, and the material of the second gate electrode 107 is the same as the material of the first gate electrode 105. Preferably, in the present embodiment, the metal material of the first gate electrode 105 and the second gate electrode 107 is molybdenum.

In addition, the metal layer forming the second gate electrode 107 is patterned to form the second gate electrode 107 having an area larger than the first gate electrode 105. That is, the orthographic projection of the first gate electrode 105 on the second gate electrode 107 is in the second gate electrode 107.

The third insulation layer 108 is formed on the second insulation layer 106. In the present embodiment, the third insulation layer 108 is a second gate insulation layer, the third gate insulation layer covers the second gate electrode 107, and the second gate insulation layer is mainly used to isolate the second gate electrode 107 from the source drain electrode 110. Preferably, the thickness of the second insulation layer 106 is 50-200 nm, wherein the material of the second gate insulation layer is the same as the material of the first gate insulation layer.

The source drain electrode 110 is formed on the third insulation layer 108. The material of the source drain electrode 110 may generally be a metal such as molybdenum, aluminum, aluminum-nickel alloy, molybdenum-tungsten alloy, chromium, copper, titanium-aluminum alloy, or a combination of several metal materials mentioned above. Preferably, in the present embodiment, the metal material of the source drain electrode 110 is titanium-aluminum alloy. The source drain electrode 110 is connected to the doped region through the first via 109.

The planarization layer 111 is formed on the source drain electrode 110, and the planarization layer 111 is used to ensure the planarity of the thin film transistor process.

The OLED layer 113 is formed on the thin film transistor layer, and the adjacent OLED layer 113 is separated by a pixel defining layer. In the present embodiment, the OLED layer 113 includes a first common layer, a light emitting layer, and a second common layer.

The first common layer is used for injection and transmission of the holes, and the first common layer comprises a hole injection layer and a hole transport layer. Therefore, the first common layer may be referred as a hole transport functional layer.

The second common layer is formed on the first common layer, and the first common layer is used for injection and transmission of the electrons. The second common layer includes an electron injection layer and an electron transport layer. Therefore, the second common layer may be referred as an electron transport function layer.

The light emitting layer is formed between the first common layer and the second common layer. The light emitting layer is an organic semiconductor having a special energy band structure, and after absorbing electrons migrated from the anode, a plurality of photons with a certain wavelength are emitted. The photons enter our eyes as the color we see.

The thin film encapsulation layer 115 is formed on the OLED layer 113. The thin film encapsulation layer 115 mainly functions as a water blocking and an oxygen blocking to prevent external moisture from eroding the organic light emitting layer. The thin film encapsulation layer 115 includes at least one organic layer and at least one inorganic layer alternately stacked. Generally, an organic encapsulation layer is located in the middle of the thin film encapsulation layer 115. The inorganic encapsulation layers are located on both sides of the thin film encapsulation layer 115, and the inorganic encapsulation layers wrap the organic encapsulation layer in the middle. In the present embodiment, the thin film encapsulation layer includes an organic layer 1151 and an inorganic layer 1152.

Although the organic encapsulation layer is very flexible, the barrier property of water and oxygen is very limited. The dense and pinhole-free organic encapsulation layer has a better barrier property of water and oxygen; however, it is difficult to prepare a dense high-quality film layer when it reaches a certain thickness. The film performance is rigid and fragile. Therefore, most of the flexible packaging materials in the world are based on the packaging structure of alternating composite structures of organic or inorganic multilayer films.

In addition, the display panel further includes an anode layer 112 and a cathode layer 114. The anode layer 112 is formed between the OLED layer 113 and the thin film transistor layer. The cathode layer 114 is formed between the OLED layer 113 and the thin film encapsulation layer 115.

The anode layer 112 is formed on the planarization layer 111. The anode layer 112 includes at least two anodes arranged in an array, and the anode layer 112 is mainly used to provide holes for absorbing electrons. In the present embodiment, the OLED device is a top emission type OLED device, and the OLED device is a white light emitting OLED device that emits white light. Therefore, the anode layer 112 is a non-transparent light blocking layer.

The cathode layer 114 is formed on the OLED layer 113, and the cathode layer 114 is used to provide the electrons. In the present embodiment, the cathode layer 114 is a transparent material, such that the light generated by the light emitting layer is projected outward through the cathode layer 114.

The first common electrode layer 116 is formed on the thin film encapsulation layer. The first common electrode layer 116 includes at least two first common electrode plates, and the first common electrode plates distributed in an array on the thin film encapsulation layer.

The cover plate 117 is formed on the first common electrode layer 116, and the cover plate 117 is used to protect the film structure of the display panel to improve the service life of the display panel.

Figure 2:
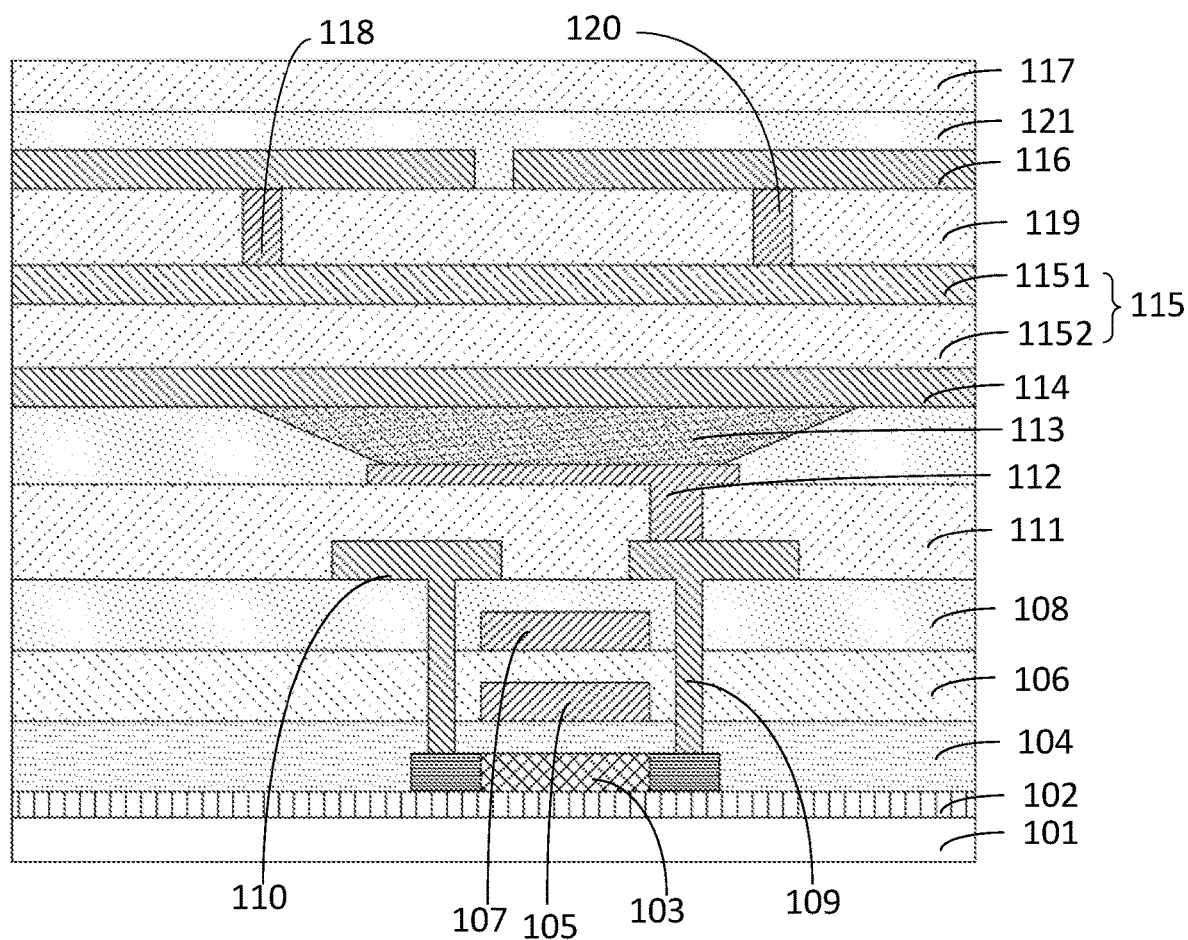
FIG. 2 is a structural diagram of a film layer of a display panel according to a second embodiment of the present invention.

In addition, the display panel further includes a plurality of conductive lines 118 formed on one side of the first common electrode layer 116, and each of the conductive lines 118 corresponds to one of the first common electrode plates. As shown in FIG. 1, the conductive lines 118 are formed between the cover plate 117 and the first common electrode plate. As shown in FIG. 2, the conductive lines 118 may also be formed between the first common electrode plate and the thin film encapsulation layer.

In addition, as shown in FIG. 1 or FIG. 2, at least one insulation layer 119 is disposed between the conductive lines 118 and the first common electrode plate. In the present embodiment, an insulation layer 119 is disposed between the conductive lines 118 and the first common electrode plate, and the material of the insulation layer 119 may be an inorganic film layer such as silicon dioxide or silicon nitride. The insulation layer 119 further includes a plurality of through holes 120, and the conductive lines 118 are electrically connected with the first common electrode plate via the through hole 120.

In addition, a protective film layer 121 is formed on the first common electrode layer 116. The material of the protective film layer 121 may be an inorganic film layer such as silicon dioxide or silicon nitride.

Figure 3:
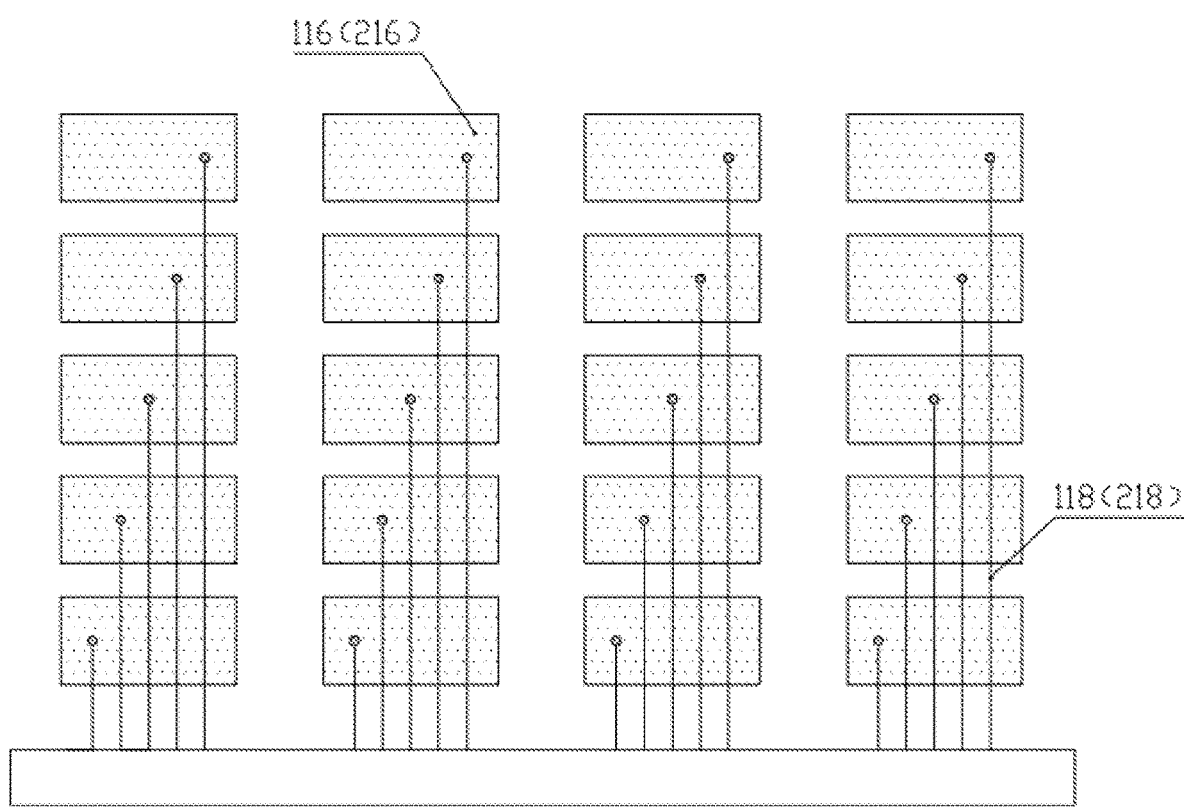
FIG. 3 is a connection diagram of a touch electrode layer and a touch signal line of a display panel of the present invention.

As shown in FIG. 3, in the present embodiment, when the display panel is in a touch state, the first common electrode plate of the first common electrode layer 116 is configured to output a touch signal according to a touch operation, and the touch signal is transmitted to a driver chip through the conductive line 118.

The present invention further provides a display device, the display device includes a display panel. As shown in FIG. 3, the display panel includes a substrate 201, a thin film transistor layer, an OLED layer 213, and a thin film encapsulation layer 215, a first common electrode layer 216, a cover plate 217, and conductive lines 218.

The substrate 201, the raw material of the substrate 201 may be one of a glass substrate, a quartz substrate, a resin substrate, and the like.

The thin film transistor layer is formed on the substrate 201. The thin film transistor layer includes an etch barrier layer (etch stop layer, ESL) type, back channel etch (back channel etch, BCE) type or a top gate thin film transistor (top-gate) type. There are no specific restrictions. This embodiment is described by taking a top gate thin film transistor type as an example.

The thin film transistor layer includes a buffer layer 202, an active layer 203, a first insulation layer 204, a first gate electrode 205, a second insulation layer 206, a second gate electrode 207, a third insulation layer 208, a source drain electrode 210, and a planarization layer.

The buffer layer 202 is formed on the substrate 201. The buffer layer 202 is mainly used for buffering the pressure between the lamellar structures of the film, and may also have a function of blocking water and oxygen.

The active layer 203 is formed on the buffer layer, and the active layer 203 includes a doped region which is doped by ions.

The first insulation layer 204 is formed on the active layer 203. In the present embodiment, the first insulation layer 204 is an interlayer insulation layer, and the interlayer insulation layer covers the active layer 203. The interlayer insulation layer is used to isolate the active layer 203 from other metal layers.

The first gate electrode 205 is formed on the first insulation layer 204. The metal material of the first gate electrode 205 may generally be a metal such as molybdenum, aluminum, aluminum-nickel alloy, molybdenum-tungsten alloy, chromium, or copper. The metal material of the first gate electrode 105 is also possible to use a combination of the above several metal materials.

The second insulation layer 206 is formed on the first gate electrode 205. In the present embodiment, the second insulation layer 206 is a first gate insulation layer, the second gate insulation layer covers the active layer 203, and the first gate insulation layer is mainly used to isolate the first gate electrode 205 and the second gate electrode 207. Preferably, the thickness of the second insulation layer 206 is 50-200 nm. The material of the first gate insulation layer is usually silicon nitride. Silicon oxide, silicon oxynitride or the like may also be used for the first gate insulation layer.

The second gate electrode 207 is formed on the second insulation layer 206, and the material of the second gate electrode 207 is the same as the material of the first gate electrode 205. Preferably, in the present embodiment, the metal material of the first gate electrode 205 and the second gate electrode 207 is molybdenum.

In addition, the metal layer forming the second gate electrode 207 is patterned to form the second gate electrode 207 having an area larger than the first gate electrode 205. That is, the orthographic projection of the first gate electrode 205 on the second gate electrode 207 is in the second gate electrode 207.

The third insulation layer 208 is formed on the second insulation layer 206. In the present embodiment, the third insulation layer 208 is a second gate insulation layer, the third gate insulation layer covers the second gate electrode 207, and the second gate insulation layer is mainly used to isolate the second gate electrode 207 from the source drain electrode 110. Preferably, the thickness of the second insulation layer 206 is 50-200 nm, wherein the material of the second gate insulation layer is the same as the material of the first gate insulation layer.

The source drain electrode 210 is formed on the third insulation layer 208. The material of the source drain electrode 210 may generally be a metal such as molybdenum, aluminum, aluminum-nickel alloy, molybdenum-tungsten alloy, chromium, copper, titanium-aluminum alloy, or a combination of several metal materials mentioned above. Preferably, in the present embodiment, the metal material of the source drain electrode 210 is titanium-aluminum alloy. The source drain electrode 210 is connected to the doped region through the first via 209.

The planarization layer 211 is formed on the source drain electrode 210, and the planarization layer 211 is used to ensure the planarity of the thin film transistor process.

The OLED layer 213 is formed on the thin film transistor layer, and the adjacent OLED layer 213 is separated by a pixel defining layer. In the present embodiment, the OLED layer 213 includes a first common layer 216, a light emitting layer 217, and conductive lines 218.

The first common layer is used for injection and transmission of the holes, and the first common layer comprises a hole injection layer and a hole transport layer. Therefore, the first common layer may be referred as a hole transport functional layer.

The second common layer is formed on the first common layer, and the first common layer is used for injection and transmission of the electrons. The second common layer includes an electron injection layer and an electron transport layer. Therefore, the second common layer may be referred as an electron transport function layer.

The light emitting layer is formed between the first common layer and the second common layer. The light emitting layer is an organic semiconductor having a special energy band structure, and after absorbing electrons migrated from the anode, a plurality of photons with a certain wavelength are emitted. The photons enter our eyes as the color we see.

The thin film encapsulation layer 215 is formed on the OLED layer 213. The thin film encapsulation layer 215 mainly functions as a water blocking and an oxygen blocking to prevent external moisture from eroding the organic light emitting layer. The thin film encapsulation layer 215 includes at least one organic layer and at least one inorganic layer alternately stacked. Generally, an organic encapsulation layer is located in the middle of the thin film encapsulation layer 215. The inorganic encapsulation layers are located on both sides of the thin film encapsulation layer 215, and the inorganic encapsulation layers wrap the organic encapsulation layer in the middle. In the present embodiment, the thin film encapsulation layer includes an organic layer 2151 and an inorganic layer 2152.

Although the organic encapsulation layer is very flexible, the barrier property of water and oxygen is very limited. The dense and pinhole-free organic encapsulation layer has a better barrier property of water and oxygen; however, it is difficult to prepare a dense high-quality film layer when it reaches a certain thickness. The film performance is rigid and fragile. Therefore, most of the flexible packaging materials in the world are based on the packaging structure of alternating composite structures of organic or inorganic multilayer films.

In addition, the display panel further includes an anode layer 212 and a cathode layer 214. The anode layer 212 is formed between the OLED layer 213 and the thin film transistor layer. The cathode layer 214 is formed between the OLED layer 213 and the thin film encapsulation layer 215.

The anode layer 212 is formed on the planarization layer 211. The anode layer 212 includes at least two anodes arranged in an array, and the anode layer 212 is mainly used to provide holes for absorbing electrons. In the present embodiment, the OLED device is a top emission type OLED device, and the OLED device is a white light emitting OLED device that emits white light. Therefore, the anode layer 212 is a non-transparent light blocking layer.

The cathode layer 214 is formed on the OLED layer 213, and the cathode layer 214 is used to provide the electrons. In the present embodiment, the cathode layer 114 is a transparent material, such that the light generated by the light emitting layer is projected outward through the cathode layer 214.

The first common electrode layer 216 is formed on the thin film encapsulation layer. The first common electrode layer 216 includes at least two first common electrode plates, and the first common electrode plates distributed in an array on the thin film encapsulation layer.

The cover plate 217 is formed on the first common electrode layer 216, and the cover plate 217 is used to protect the film structure of the display panel to improve the service life of the display panel.

Figure 4:
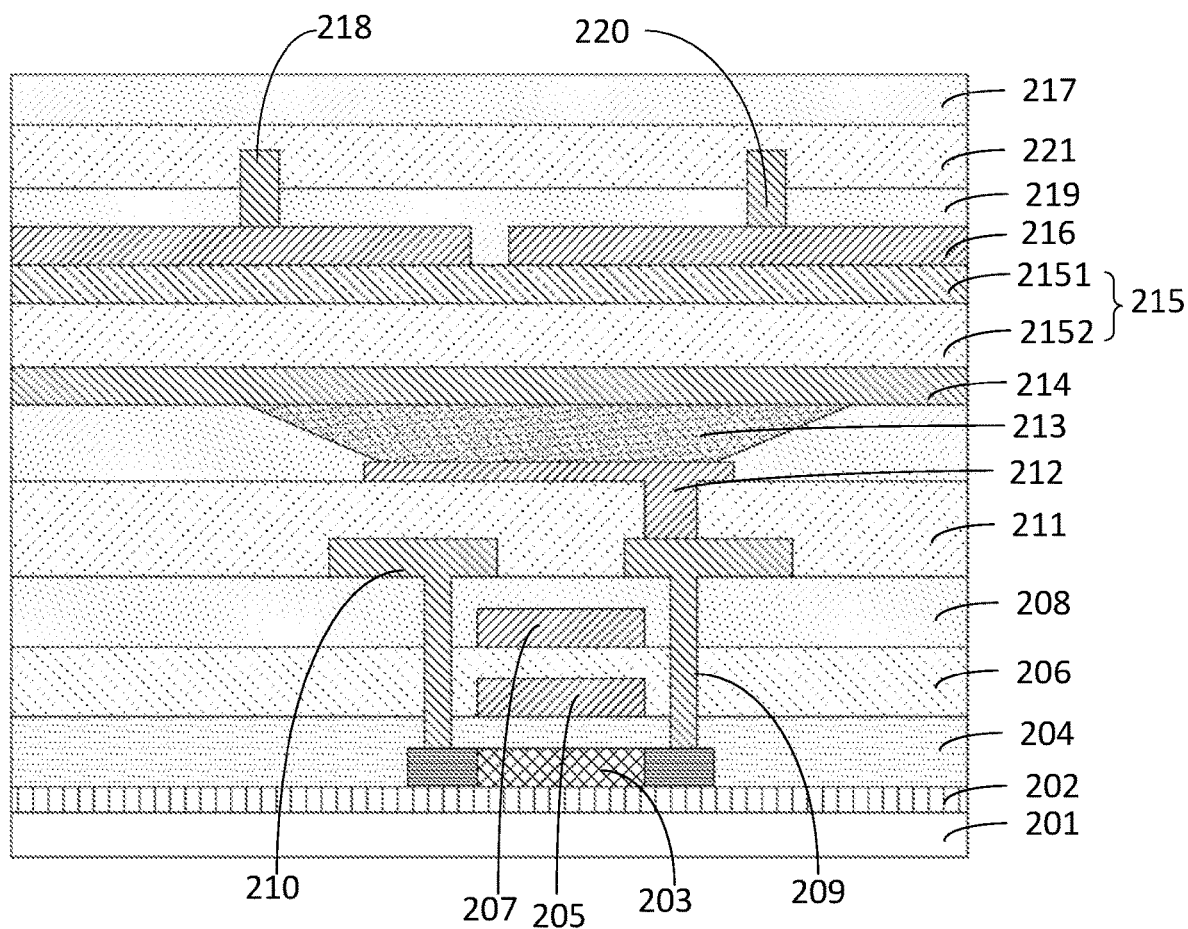
FIG. 4 is a structural diagram of a film layer of a display panel according to a third embodiment of the present invention.
Figure 5:
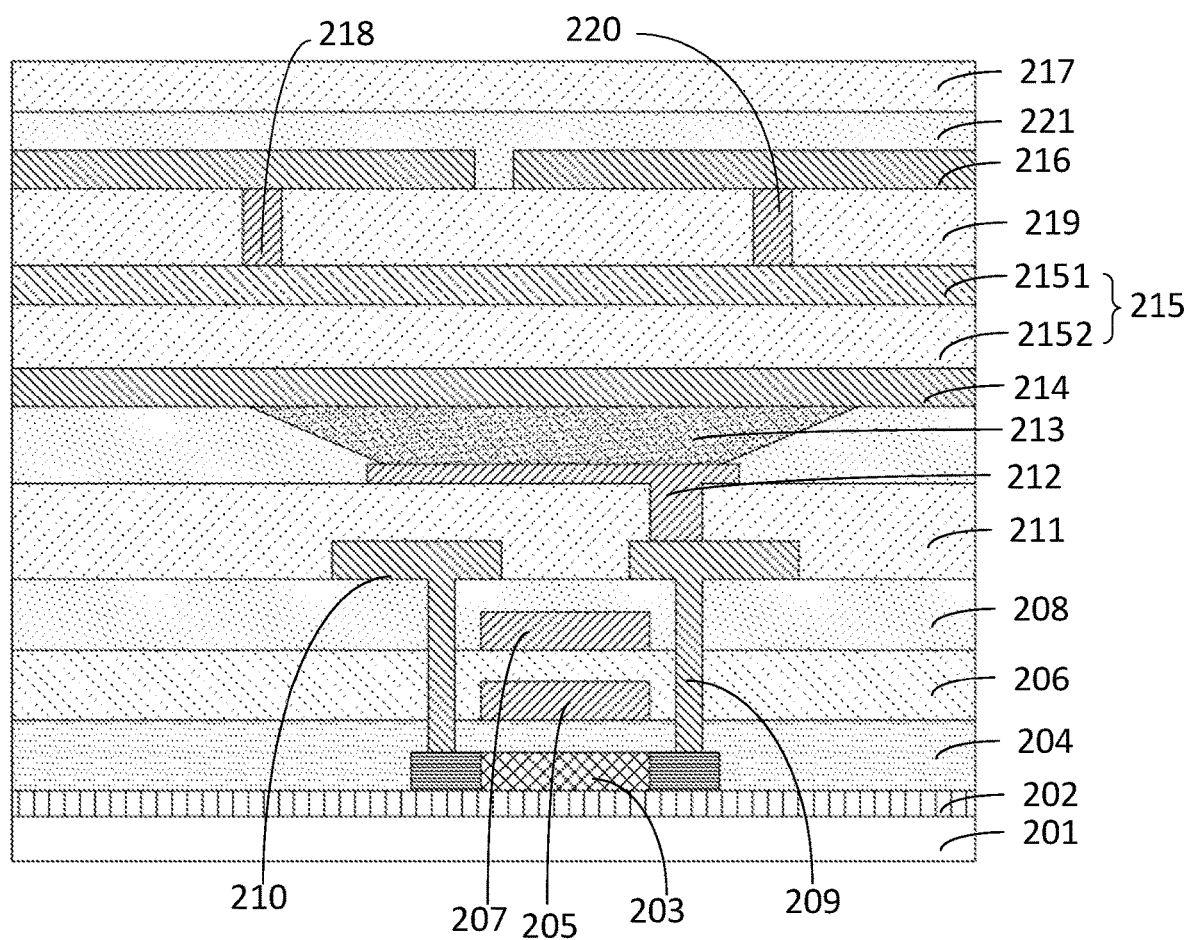
FIG. 5 is a structural diagram of a film layer of a display panel according to a fourth embodiment of the present invention.

In addition, the display panel further includes a plurality of conductive lines 218 formed on one side of the first common electrode layer 216, and each of the conductive lines 218 corresponds to one of the first common electrode plates. As shown in FIG. 3, the conductive lines 218 are formed between the cover plate 217 and the first common electrode plate. As shown in FIG. 4, the conductive lines 218 may also be formed between the first common electrode plate and the thin film encapsulation layer.

In addition, as shown in FIG. 1 or FIG. 2, at least one insulation layer 219 is disposed between the conductive lines 218 and the first common electrode plate. In the present embodiment, an insulation layer 219 is disposed between the conductive lines 218 and the first common electrode plate, and the material of the insulation layer 219 may be an inorganic film layer such as silicon dioxide or silicon nitride. The insulation layer 219 further includes a plurality of through holes 220, and the conductive lines 218 are electrically connected with the first common electrode plate via the through hole 220.

In addition, a protective film layer 221 is formed on the first common electrode layer 216. The material of the protective film layer 221 may be an inorganic film layer such as silicon dioxide or silicon nitride.

As shown in FIG. 3, in the present embodiment, when the display panel is in a touch state, the first common electrode plate of the first common electrode layer 216 is configured to output a touch signal according to a touch operation, and the touch signal is transmitted to a driver chip through the conductive line 218.

The present invention further provides a display panel and a display device, the display device includes a display panel. The display panel includes a substrate, a thin film transistor layer, an OLED layer, a thin film encapsulation layer, a first common electrode layer, a cover plate, and conductive lines. the present invention eliminates the area without touch- control function on the display panel and improves the touch precision of the OLED touch screen by placing a plurality of conductive lines on one side of the first common electrode plate, by placing the conductive lines and the first common electrode plate on the two film layers respectively, and electrically connecting via the through holes of the insulation layer.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A display panel, comprising:
   a substrate;
   a thin film transistor layer formed on the substrate;
   an organic light emitting diode (OLED) layer formed on the thin film transistor layer;
   a thin film encapsulation layer formed on a cathode layer;
   a first common electrode layer formed on the thin film encapsulation layer, wherein the first common electrode layer includes at least two first common electrode plates;
   a cover plate formed on the first common electrode layer; and
   conductive lines formed between the cover plate and the first common electrode plates of the first common electrode layer, or between the first common electrode plates of the first common electrode layer and the thin film encapsulation layer, wherein the conductive lines correspond to the first common electrode plates;
   at least one insulation layer disposed between the conductive lines and the first common electrode plates, wherein the insulation layer is formed with at least one through hole, the conductive lines are electrically connected with the first common electrode plates via the through hole;
   wherein when the display panel is in a touch state, the first common electrode plates of the first common electrode layer are configured to output a touch signal according to a touch operation, and the touch signal is transmitted to a driver chip through the conductive lines.

2. A display device, comprising a display panel, which comprises:
   a substrate;
   a thin film transistor layer formed on the substrate;
   an organic light emitting diode (OLED) layer formed on the thin film transistor layer;
   a thin film encapsulation layer formed on a cathode layer;
   a first common electrode layer formed on the thin film encapsulation layer, wherein the first common electrode layer includes at least two first common electrode plates;
   a cover plate formed on the first common electrode layer;
   conductive lines formed at a side of the first common electrode layer, wherein the conductive lines are formed between the cover plate and the first common electrode plates, and the conductive lines correspond to the first common electrode plates; and
   at least one through hole formed in an insulation layer, wherein the through hole the electrically connect the conductive line and the first common electrode plate of the first common electrode layer;
   wherein when the display panel is in a touch state, the first common electrode plates of the first common electrode layer are configured to output a touch signal according to a touch operation, and the touch signal is transmitted to a driver chip through the conductive lines.

3. The display device according to claim 2, wherein the conductive lines are formed between the first common electrode plates and the thin film encapsulation layer.

4. The display device according to claim 2, wherein at least one insulation layer is disposed between the conductive lines and the first common electrode plates.

5. The display device according to claim 4, wherein the insulation layer further comprises at least one through hole,
the conductive lines are electrically connected with the first common electrode plates via the through hole.

6. A display panel, comprising:
a substrate;
a thin film transistor layer formed on the substrate;
an organic light emitting diode (OLED) layer formed on the thin film transistor layer;
a thin film encapsulation layer formed on a cathode layer;
a first common electrode layer formed on the thin film encapsulation layer, wherein the first common electrode layer includes at least two first common electrode plates;
a cover plate formed on the first common electrode layer; and
conductive lines formed at a side of the first common electrode layer, wherein the conductive lines are formed between the cover plate and the first common electrode plates, and the conductive lines correspond to the first common electrode plates;
an insulation layer comprising at least one through hole, wherein the conductive lines are electrically connected with the first common electrode plates via the through hole;
wherein when the display panel is in a touch state, the first common electrode plates of the first common electrode layer are configured to output a touch signal according to a touch operation, and the touch signal is transmitted to a driver chip through the conductive lines.

* * * * *